(12) United States Patent
Kawanaka et al.

(10) Patent No.: US 10,161,980 B2
(45) Date of Patent: Dec. 25, 2018

(54) DETERIORATION DETECTING APPARATUS AND DETERIORATION DETECTING METHOD

(71) Applicant: FUJITSU TEN LIMITED, Hyogo-ku (JP)

(72) Inventors: Shota Kawanaka, Kobe (JP); Sho Tamura, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 325 days.

(21) Appl. No.: 15/045,402

(22) Filed: Feb. 17, 2016

(65) Prior Publication Data

US 2016/0252556 A1 Sep. 1, 2016

(30) Foreign Application Priority Data

Feb. 27, 2015 (JP) ................................ 2015-039396
Feb. 27, 2015 (JP) ................................ 2015-039397

(51) Int. Cl.
*G01R 31/14* (2006.01)
*G01R 31/00* (2006.01)
*G01R 31/36* (2006.01)
G01R 27/02 (2006.01)

(52) U.S. Cl.
CPC ......... *G01R 31/006* (2013.01); *G01R 31/362* (2013.01); *G01R 31/3606* (2013.01); *G01R 27/025* (2013.01); *G01R 31/3658* (2013.01)

(58) Field of Classification Search
CPC .... G01R 31/006; G01R 31/028; G01R 31/14; G01R 31/41

USPC ....... 324/549, 548, 509, 604, 433, 382, 120, 324/121 R
See application file for complete search history.

(56) References Cited

U.S. PATENT DOCUMENTS

| 4,381,479 A | * | 4/1983 | Wesling | ................ | H02M 3/157 388/811 |
| 5,225,776 A | * | 7/1993 | Dobos | .................... | G01R 13/34 324/121 R |
| 8,198,902 B2 | | 6/2012 | Kawamura | | |
| 9,817,056 B2 | | 11/2017 | Kawamura | | |

(Continued)

FOREIGN PATENT DOCUMENTS

JP 2007-170983 A 7/2007
JP 2008-089322 A 4/2008

(Continued)

OTHER PUBLICATIONS

Oct. 23, 2018 Office Action issued in Japanese Patent Application No. 2015-039396.

(Continued)

*Primary Examiner* — Jermele M Hollington
*Assistant Examiner* — Taqi Nasir
(74) *Attorney, Agent, or Firm* — Oliff PLC

(57) ABSTRACT

A deterioration detecting apparatus includes: a capacitor that is connected to an insulated electric power source, and is charged and discharged; a voltage detecting unit that detects a voltage of the capacitor; and a deterioration detecting unit that detects a deterioration in insulating resistors of the electric power source on the basis of the voltage of the capacitor detected by the voltage detecting unit, in which the voltage detecting unit can detect the charged negative voltage of the capacitor.

11 Claims, 12 Drawing Sheets

(56) References Cited

U.S. PATENT DOCUMENTS

| | | | |
|---|---|---|---|
| 2002/0097053 A1* | 7/2002 | Tamagawa | B60K 6/485 324/382 |
| 2004/0041773 A1* | 3/2004 | Takeda | G09G 3/3655 345/98 |
| 2006/0158274 A1* | 7/2006 | Self | H03K 5/14 331/107 SL |
| 2010/0161259 A1* | 6/2010 | Kim | G05B 23/0283 702/63 |
| 2011/0006781 A1 | 1/2011 | Kawamura | |
| 2011/0012606 A1* | 1/2011 | Kawamura | B60L 3/0023 324/509 |
| 2012/0153966 A1* | 6/2012 | Kawamura | G01R 31/028 324/548 |
| 2013/0265058 A1* | 10/2013 | Danner | G01R 31/362 324/433 |
| 2015/0022219 A1 | 1/2015 | Kawamura | |

FOREIGN PATENT DOCUMENTS

| | | | |
|---|---|---|---|
| JP | 2009-041920 A | 2/2009 | |
| JP | 2009-177301 A | 8/2009 | |
| JP | 2011-017586 A | 1/2011 | |
| JP | 2014-020914 A | 2/2014 | |
| JP | 2015-021845 A | 2/2015 | |

OTHER PUBLICATIONS

Oct. 23, 2018 Office Action issued in Japanese Patent Application No. 2015-039397.

* cited by examiner

DETERIORATION DETECTING APPARATUS AND DETERIORATION DETECTING METHOD

CROSS-REFERENCE TO RELATED APPLICATIONS

This application is based on and claims priority under 35 USC 119 from Japanese Patent Application No. 2015-039396 filed on Feb. 27, 2015 and Japanese Patent Application No. 2015-039397 filed on Feb. 27, 2015, the entire contents of which are incorporated herein by reference.

BACKGROUND

1. Technical Field

The present invention relates to a deterioration detecting apparatus and a deterioration detecting method.

2. Related Art

According to the related art, a vehicle such as a hybrid electric vehicle or an electric vehicle includes an electric power source for supplying electric power to a motor which is a power source. The electric power source is configured so as to be insulated from the body of the vehicle. Also, there is known an apparatus for monitoring the insulated state of such an electric power source, in other words, an apparatus for detecting a deterioration in an insulation resistor of an electric power source (see JP-A-2014-20914 for instance).

SUMMARY

At least one embodiment of the present invention provides a deterioration detecting apparatus includes a capacitor, a voltage detecting unit, and a deterioration detecting unit. The capacitor is connected to an insulated electric power source, thereby being charged or discharged. The voltage detecting unit detects the voltage of the capacitor. The deterioration detecting unit detects a deterioration in insulating resistors of the electric power source on the basis of the voltage of the capacitor detected by the voltage detecting unit. Further, the voltage detecting unit can detect the charged negative voltage of the capacitor.

According to the at least one embodiment of the present invention, even in a case where the deterioration detecting apparatus includes a voltage converter for raising a voltage output from the electric power source, it is possible to improve the accuracy of detection on a deterioration in the insulating resistors of the electric power source.

DESCRIPTION OF EMBODIMENTS

Hereinafter, deterioration detecting apparatuses and deterioration detecting methods according to embodiments of the present invention will be described in detail with reference to the accompanying drawings. However, the present invention is not limited to the embodiments to be described below.

First Embodiment

1. Configuration of Charging/Discharging System

Figure 1:
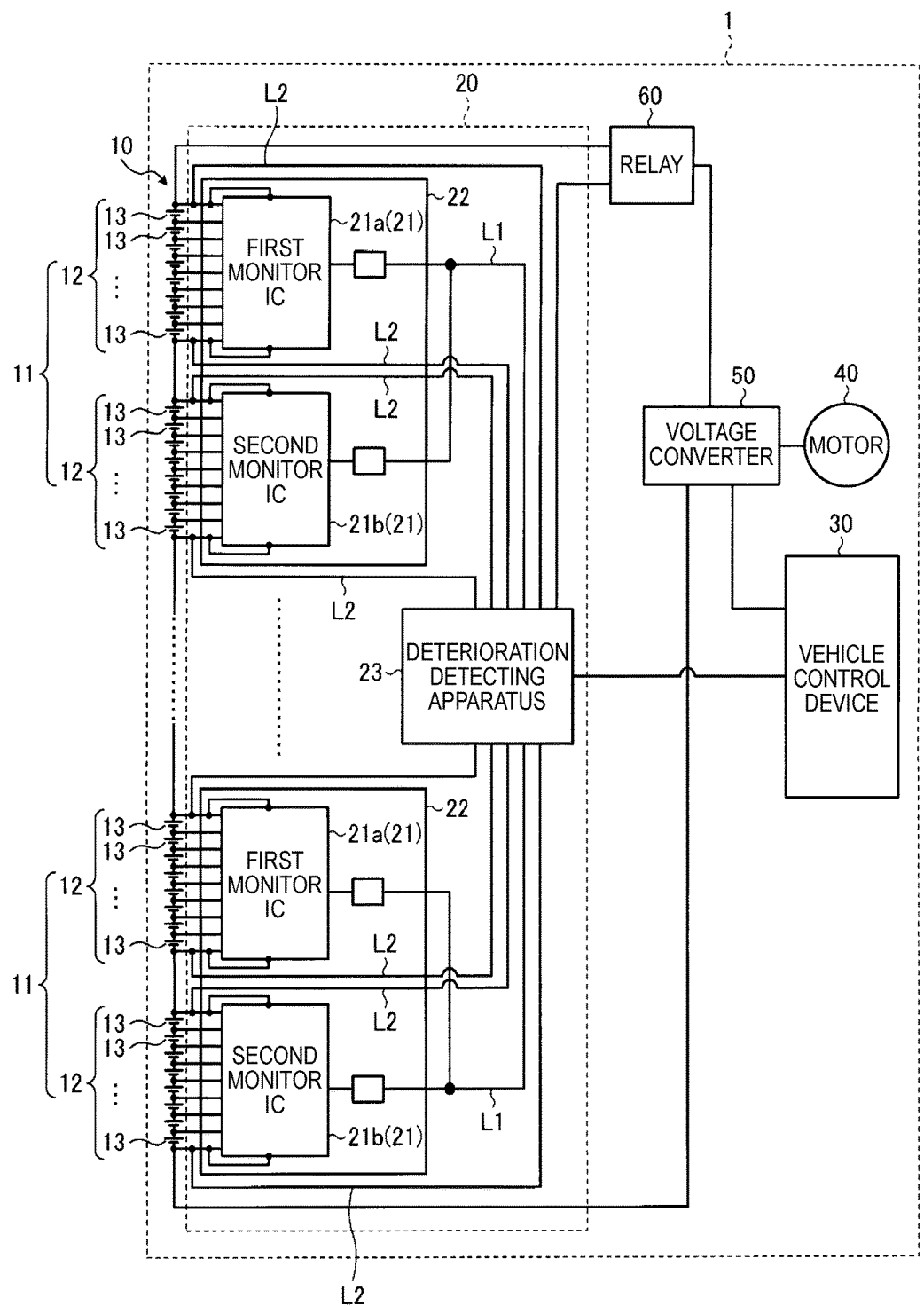
FIG. 1 is a block diagram illustrating an example of the configuration of a charging/discharging system including a deterioration detecting apparatus according to a first embodiment.

FIG. 1 is a block diagram illustrating an example of the configuration of a charging/discharging system including a deterioration detecting apparatus according to a first embodiment. A charging/discharging system 1 is mounted on a vehicle (not shown) such as a hybrid electric vehicle (HEV), an electric vehicle (EV), or a fuel cell vehicle (FCV). The charging/discharging system 1 is a system for performing charging and discharging of an electric power source for supplying electric power to a motor which is the power source of the vehicle.

Specifically, the charging/discharging system 1 includes an assembled battery 10, a battery monitoring system 20, a vehicle control device 30, a motor 40, a voltage converter 50, and a relay 60 for a fail-safe. Also, the battery monitoring system 20 includes a plurality of satellite boards 22 having monitor integrated circuits (ICs) 21 and so on, and a deterioration detecting apparatus 23.

The assembled battery 10 is an electric power source (a battery) which is insulated from the body of the vehicle (not shown), and is configured by a plurality of blocks 11. One block 11 includes a plurality of, for example, two battery stacks 12 connected in series. Also, one battery stack 12 includes, for example, a plurality of battery cells 13 connected in series.

However, the number of blocks 11, battery stacks 12, or battery cells 13 is not limited to that described above or shown in the drawings. Also, as the assembled battery 10, for example, a lithium ion secondary battery, a nickel-hydrogen secondary battery, or the like can be used. However, the assembled battery is not limited thereto.

The plurality of battery cells 13 of each battery stack is electrically connected to a corresponding one of the monitor ICs 21 installed on the satellite boards 22. Also, the voltage of each battery cell 13 is detected by a corresponding monitor IC 21. Further, the monitor ICs 21 are composed of first monitor ICs 21a and second monitor ICs 21b, and each of the first and second monitor ICs 21a and 21b detects the voltage of a corresponding battery stack 12 corresponding to twelve battery cells 13.

The deterioration detecting apparatus 23 detects a deterioration in an insulating resistor (to be described below) of the battery monitoring system 20. This will be described below. Here, a deterioration in an insulating resistor means that the electricity of the assembled battery 10 leaks, for example, due to a decrease in the resistance value of the insulating resistor.

Also, the deterioration detecting apparatus 23 has a function of monitoring the voltage of each of the battery stacks 12 while monitoring the voltage of each of the battery cells 13. In other words, the deterioration detecting apparatus 23 monitors the charged state of the assembled battery 10.

Specifically, the deterioration detecting apparatus 23 transmits a voltage detection request to the monitor ICs 21, thereby performing control such that the monitor ICs detect the voltages of the battery cells 13, respectively, and receives the detection results through communication lines L1. In this way, the deterioration detecting apparatus monitors the voltages of the battery cells 13. Also, the deterioration detecting apparatus 23 charges capacitors (to be described below) with the voltages of the battery stacks 12 (hereinafter, also referred to as the "stack voltages") through conductive wires L2, thereby directly measuring the stack voltages. In this way, the deterioration detecting apparatus monitors the charged state of the assembled battery 10.

Also, it is preferable that the deterioration detecting apparatus 23 should further have a function of determining whether the monitor ICs 21 are normally operating. Specifically, for example, the deterioration detecting apparatus 23 adds the voltages of the battery cells 13 received from each monitor IC 21, thereby obtaining a stack voltage, and compares the stack voltage with a directly detected stack voltage. If the difference between them is larger than an allowable value, the deterioration detecting apparatus determines that the corresponding monitor IC 21 is abnormal. In a case where it is determined that a monitor IC 21 is abnormal, for example, the deterioration detecting apparatus 23 may separate the relay 60 for a fail-safe from the corresponding monitor IC such that charging and discharging on corresponding battery cells 13 is not performed.

The voltage converter 50 includes a boost converter 51 (see FIG. 3) and an inverter (not shown), and raises a DC voltage output from the assembled battery 10 which is an electric power source, and converts the DC voltage into an AC voltage. Also, although the deterioration detecting apparatus 23 and the voltage converter 50 are separately shown in FIG. 1, this is illustrative and does not limit the present invention. For example, the deterioration detecting apparatus 23 may be configured so as to include the voltage converter 50.

The vehicle control device 30 performs charging and discharging on the assembled battery 10 according to the charged state of the assembled battery 10, thereby controlling the vehicle. Specifically, if the voltage of the assembled battery 10 is raised and is converted into an AC voltage by the voltage converter 50, the vehicle control device 30 supplies the AC voltage to the motor 40, thereby driving the motor 40. As a result, the assembled battery 10 is discharged.

Also, although the motor 40 has been exemplified above as an electric load to which the voltage is supplied from the voltage converter 50, this is illustrative, and does not limit the present invention. For example, the electric load may be any other electric component called an air conditioner, an illuminating lamp, an audio system, or a car navigation system.

The vehicle control device 30 converts an AC voltage generated by regenerative braking of the motor 40, into a DC voltage, by the voltage converter 50, and supplies the DC voltage to the assembled battery 10. As a result, the assembled battery 10 is charged. As described above, the vehicle control device 30 monitors the voltage of the assembled battery 10 on the basis of the charged state of the assembled battery 10 acquired from the deterioration detecting apparatus 23, and performs control according to the monitoring result.

2. Configuration of Deterioration Detecting Apparatus

Figure 2:
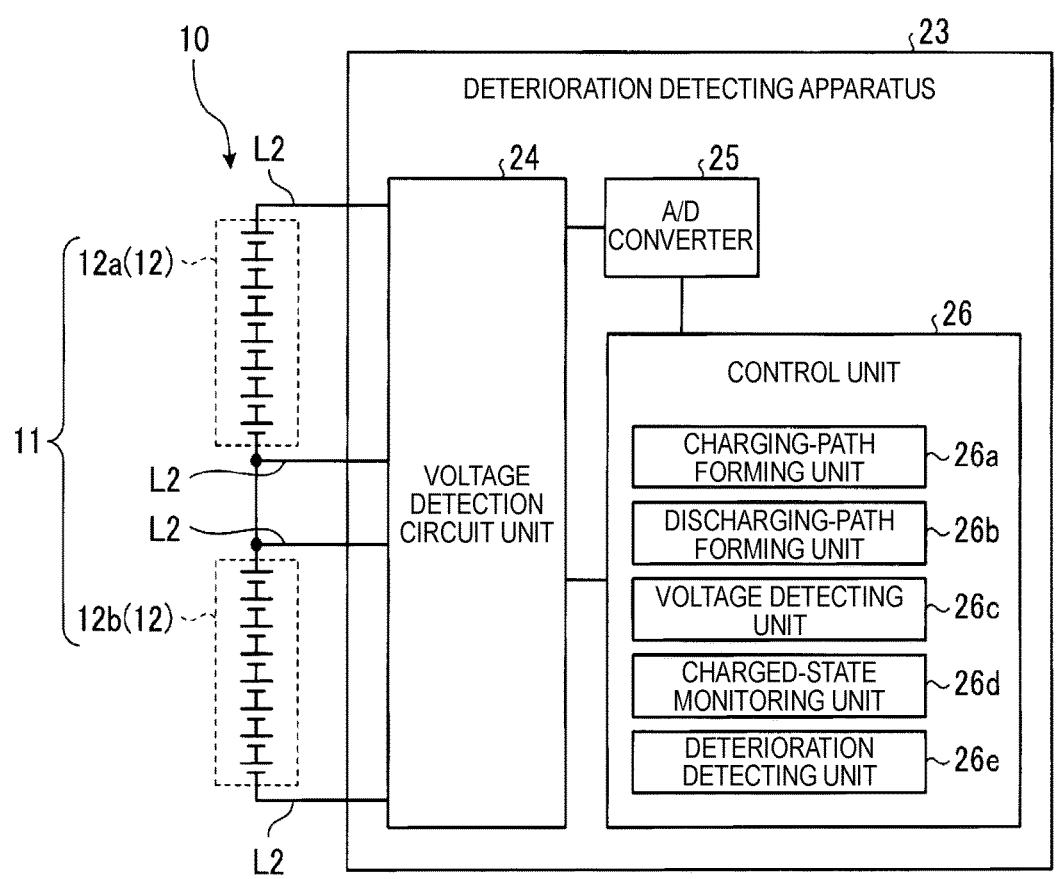
FIG. 2 is a block diagram illustrating an example of the configuration of the deterioration detecting apparatus.

Now, the configuration of the deterioration detecting apparatus 23 will be described. FIG. 2 is a block diagram illustrating an example of the configuration of the deterioration detecting apparatus 23. However, in FIG. 2, some components such as the satellite boards 22 and the communication lines L1 are not shown. Also, for the purpose of easy understanding, one of the plurality of blocks 11 is shown in FIG. 2, and hereinafter, one of two battery stacks 12 of one block 11 will also be referred to as a "first stack 12a", and the other will also be referred to as a "second stack 12b".

The deterioration detecting apparatus 23 is, for example, an electronic control unit (ECU), and includes a voltage detection circuit unit 24, an A/D converter 25, and a control unit 26 as shown in FIG. 2.

The voltage detection circuit unit 24 includes a circuit for performing detection on the voltage of each stack, detection on a deterioration in an insulating resistor, and the like. Now, the voltage detection circuit unit 24 will be described in detail with reference to FIG. 3.

Figure 3:
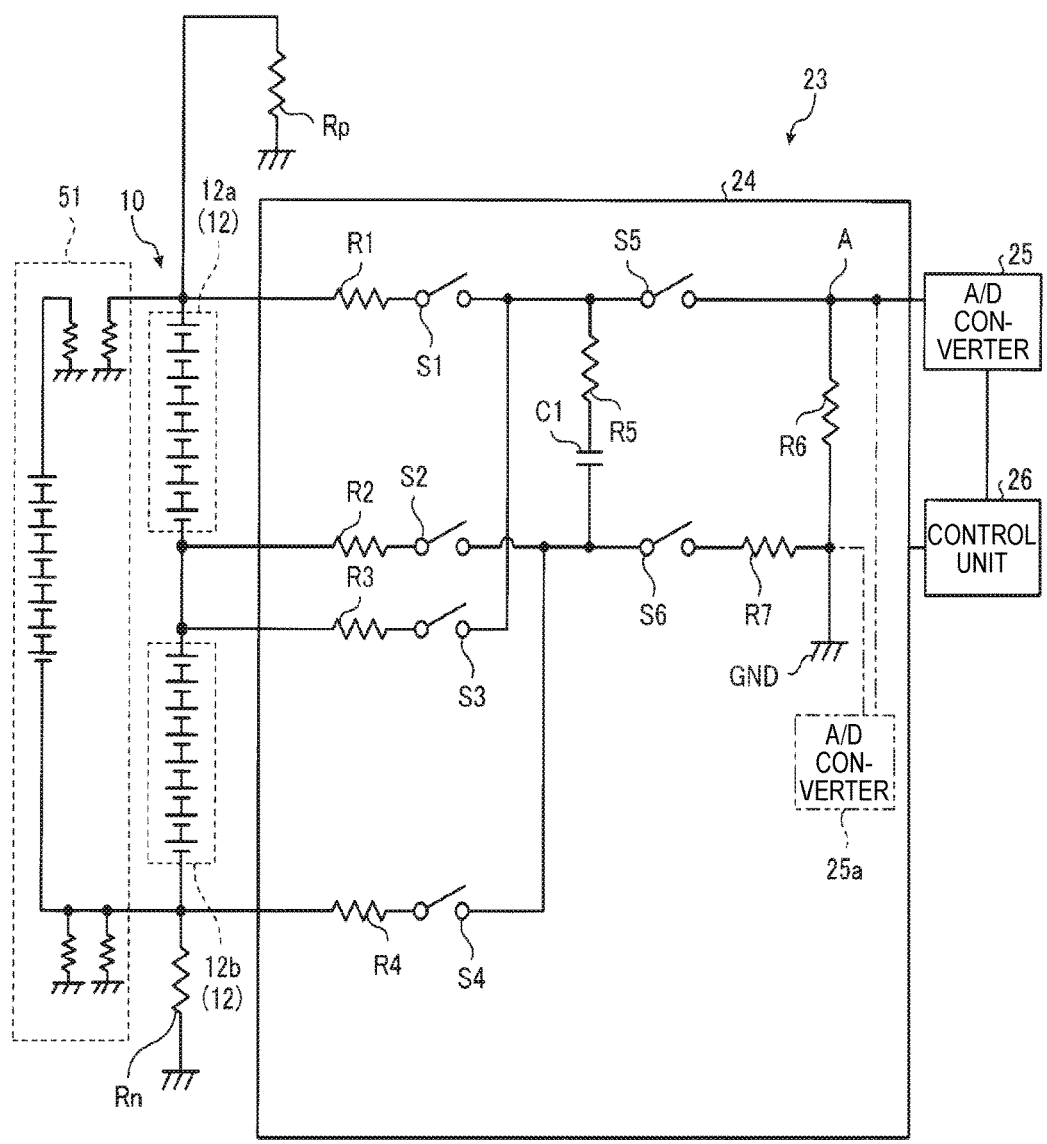
FIG. 3 is a view illustrating an example of the configuration of a voltage detection circuit unit.

FIG. 3 is a view illustrating an example of the configuration of the voltage detection circuit unit 24. As shown in FIG. 3, the voltage detection circuit unit 24 includes a capacitor C1, a first switch S1 to a sixth switch S6, and a first resistor R1 to a seventh resistor R7. Also, the assembled battery 10 has an insulating resistor Rp on the positive electrode side, and includes an insulating resistor Rn on the negative electrode side.

The voltage detection circuit unit 24 uses a flying capacitor system, and charges the capacitor C1 with the voltage of each of the stacks 12a and 12b, and detects the voltage of the capacitor C1 as the voltage of the corresponding stack 12a or 12b.

Specifically, the voltage detection circuit unit 24 includes a charging circuit and a discharging circuit with the capacitor C1 interposed therebetween. The charging circuit is a portion which is configured by connecting the stacks 12a and 12b of the assembled battery 10 with the capacitor C1 and includes paths for charging the capacitor C1 with the voltage of each stack 12a or 12b. Also, the discharging circuit is a portion including a path for discharging the charged voltage of the capacitor C1.

Further, turning on or off of each of the switches S1 to S6 is controlled, whereby charging and discharging on the capacitor C1 are controlled. Also, as the switches S1 to S6 described above, for example, solid state relays (SSRs) can be used. However, those switches are not limited thereto. Also, the first resistor R1 to the seventh resistor R7 are resistors usable to detect the voltage of the capacitor C1.

In the charging circuit of the voltage detection circuit unit 24, each of the first stack 12a and the second stack 12b is connected in parallel with the capacitor C1. In other words, both ends of the capacitor C1 are connected to the positive electrode and the negative electrode of the first stack 12a, and are connected to the positive electrode and the negative electrode of the second stack 12b.

Also, between the positive electrode side of the first stack 12a and the capacitor C1, the first resistor R1, the first switch S1, and the fifth resistor R5 are provided in series, and between the negative electrode side of the first stack 12a and the capacitor C1, the second resistor R2 and the second switch S2 are provided in series.

Also, between the positive electrode side of the second stack 12b and the capacitor C1, the third resistor R3, the third switch S3, and the fifth resistor R5 are provided in series, and between the negative electrode side of the second stack 12b and the capacitor C1, the fourth resistor R4 and the fourth switch S4 are provided in series.

In the discharging circuit of the voltage detection circuit unit 24, the fifth switch S5 is provided on a path positioned on the positive electrode sides of the first stack 12a and the second stack 12b, and the fifth resistor R5 is provided between one end of the fifth switch S5 and the capacitor C1. Also, the sixth switch S6 is provided on a path positioned on the negative electrode sides of the first and second stacks 12a and 12b, and one end of the sixth switch S6 is connected to the capacitor C1.

Further, the other end of the fifth switch S5 is connected to the A/D converter 25, and is also connected to a vehicle body GND through the sixth resistor R6. Also, the other end of the sixth switch S6 is connected to the vehicle body GND through the seventh resistor R7. Also, the vehicle body GND is an example of a ground point, and the voltage of the ground point will also be referred to as the "body voltage".

The A/D converter 25 converts an analog value representing the voltage on a detection point A of the voltage detection circuit unit 24, into a digital value, and outputs the digital value to the control unit 26 (exactly, a voltage detecting unit (to be described below) or the like).

Figure 4:
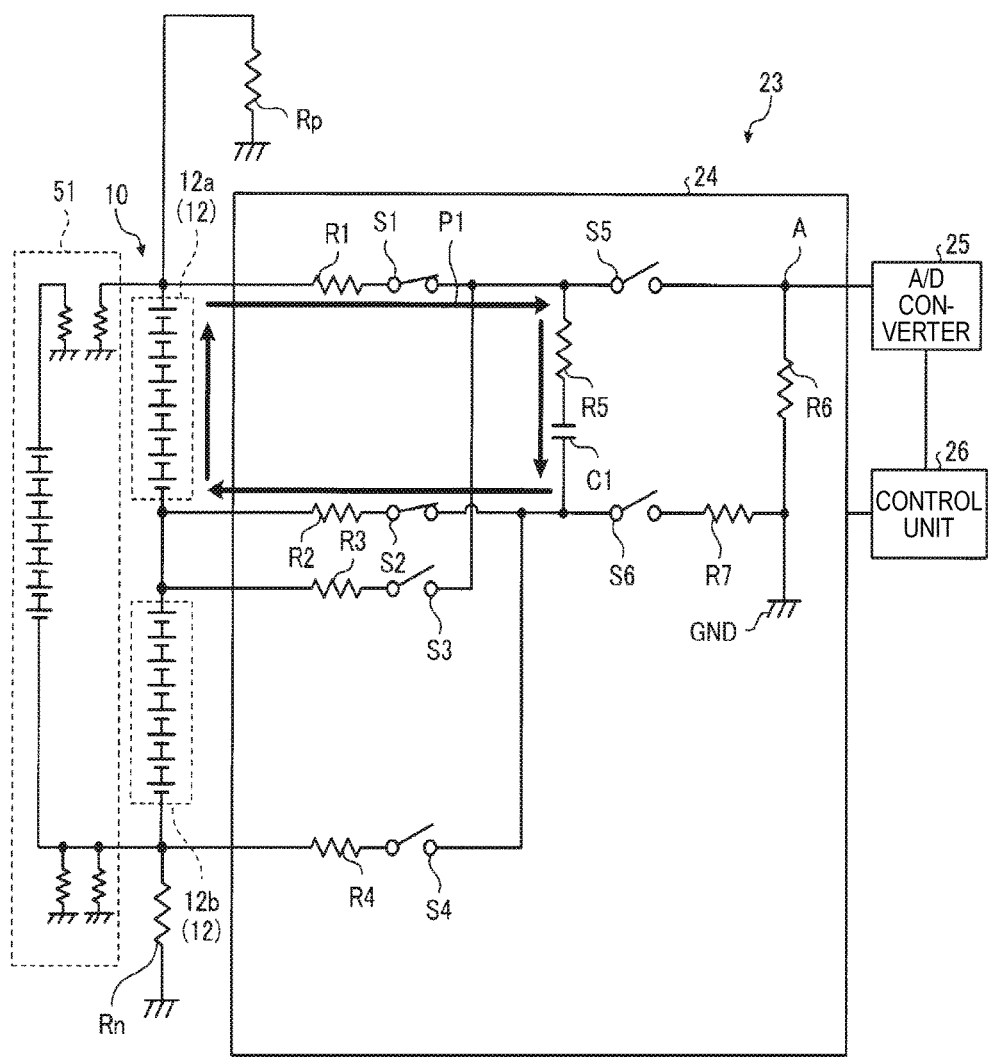
FIG. 4 is a view illustrating a charging path for charging a capacitor with the voltage of a first stack.
Figure 5:
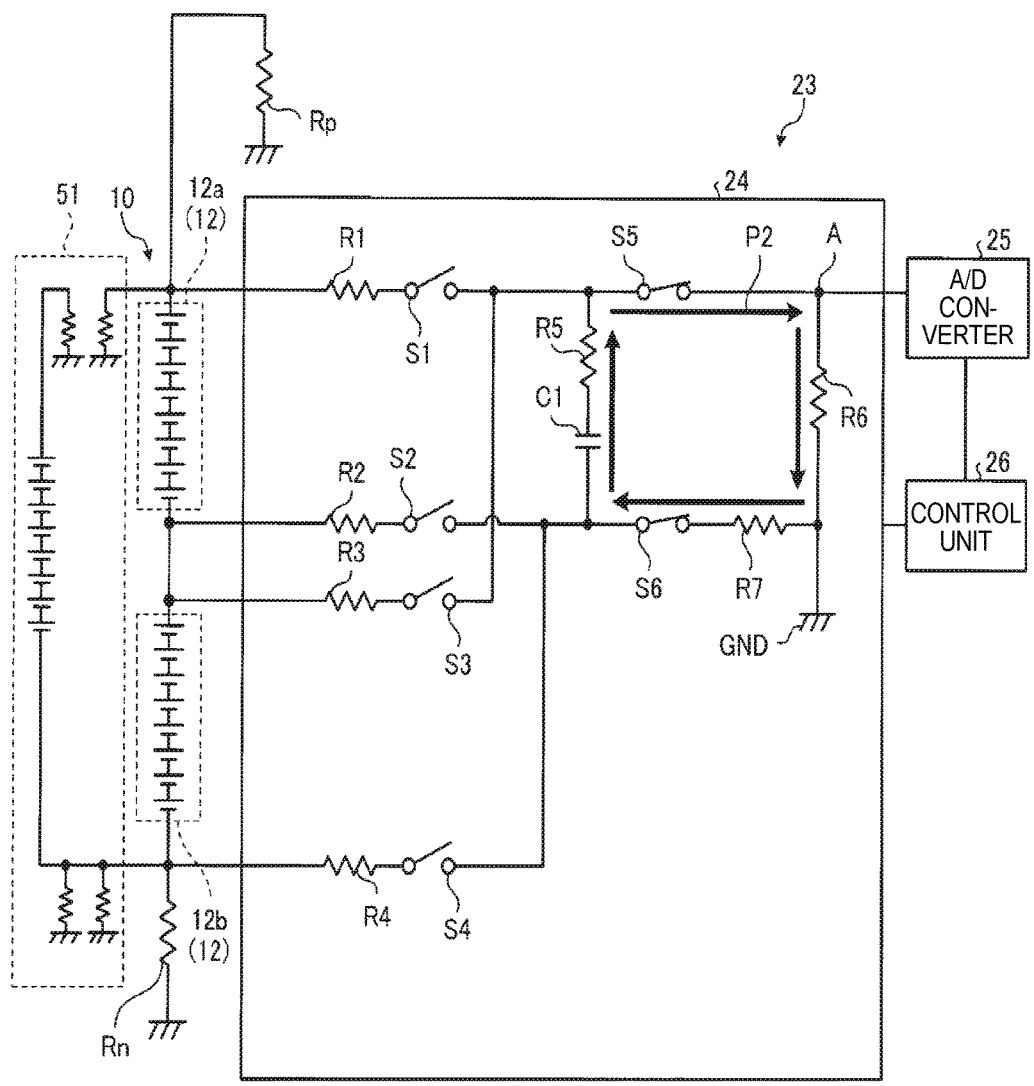
FIG. 5 is a view illustrating a discharging path for discharging the charged capacitor.
Figure 6:
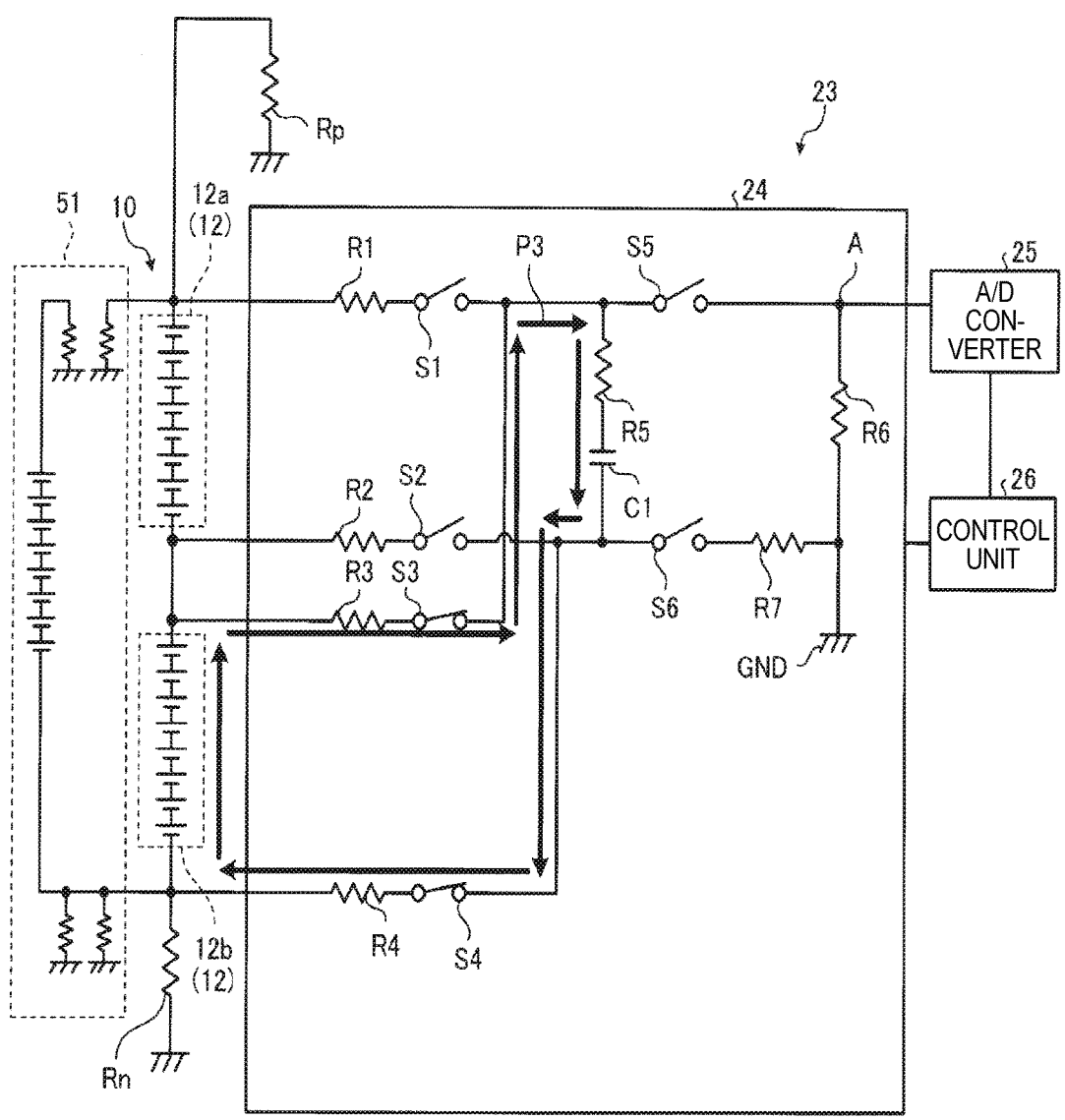
FIG. 6 is a view illustrating a charging path for charging the capacitor with the voltage of a second stack.

Now, charging and discharging of the capacitor C1 which are performed in order to detect the voltages of the first and second stacks 12a and 12b will be described with reference to FIGS. 4 to 6. FIG. 4 is a view illustrating a charging path for charging the capacitor C1 with the voltage of the first stack 12a. Also, FIG. 5 is a view illustrating a discharging path for discharging the charged capacitor C1, and FIG. 6 is a view illustrating a charging path for charging the capacitor C1 with the voltage of the second stack 12b.

In the deterioration detecting apparatus 23, the capacitor C1 is charged by each of the first and second stacks 12a and 12b. First, an example in which the capacitor C1 is charged with the voltage of the first stack 12a (hereinafter, also referred to as the "first stack voltage") will be described. As shown in FIG. 4, the first switch S1 and the second switch S2 are turned on, and the other switches S3 to S6 are turned off.

As a result, the positive electrode side of the first stack 12a is connected to the negative electrode side of the first stack 12a through the first resistor R1, the first switch S1, the fifth resistor R5, the capacitor C1, the second switch S2, and the second resistor R2. In other words, a first path P1 is formed so as to connect the first stack 12a and the capacitor C1, whereby the capacitor C1 is charged with the first stack voltage.

After the first path P1 is formed, if a predetermined time elapses, the voltage of the capacitor C1 is discharged. Specifically, as shown in FIG. 5, the first switch S1 and the second switch S2 are turned off while the fifth switch S5 and the sixth switch S6 are turned on.

As a result, in the voltage detection circuit unit 24, a second path P2 is formed as a discharging path. Since the other end of the fifth switch S5 is connected to the A/D converter 25, if the second path P2 is formed, the voltage of the capacitor C1 (that is, the first stack voltage) is input to the A/D converter 25. Also, if an analog value is input at the moment when the fifth and sixth switches S5 and S6 are turned on, the A/D converter 25 converts the analog value into a digital value, and outputs the digital value to the control unit 26. As a result, the first stack voltage is detected.

Now, an example in which the capacitor C1 is charged with the voltage of the second stack 12b (hereinafter, also referred to as the "second stack voltage") will be described. As shown in FIG. 6, the third switch S3 and the fourth switch S4 are turned on, and the other switches S1, S2, S5, and S6 are turned off.

As a result, the positive electrode side of the second stack 12b is connected to the negative electrode side of the second stack 12b through the third resistor R3, the third switch S3, the fifth resistor R5, the capacitor C1, the fourth switch S4, and the fourth resistor R4. In other words, a third path P3 is formed so as to connect the second stack 12b and the capacitor C1, whereby the capacitor C1 is charged with the second stack voltage.

After the third path P3 is formed, if a predetermined time elapses, the third and fourth switches S3 and S4 are turned off while the fifth and sixth switch S5 and S6 are turned on, whereby the voltage of the capacitor C1 is discharged (see FIG. 5).

In other words, the second path P2 is formed in the voltage detection circuit unit 24, whereby the voltage of the capacitor C1 (that is, the second stack voltage) is input to the A/D converter 25. Then, as described above, the A/D converter 25 converts an analog value representing the input voltage into a digital value, and outputs the digital value to the control unit 26. As a result, the second stack voltage is detected.

Since charging and discharging on the capacitor C1 are performed by switching between each charging path and the discharging path as described above, it is possible to detect the first stack voltage and the second stack voltage.

Also, in the circuit of the voltage detection circuit unit 24, as shown in FIG. 3, the insulating resistor Rp and the insulating resistor Rn are provided on the positive electrode side and negative electrode side of the assembled battery 10, respectively. Also, each of the insulating resistors Rp and Rn represents the combined resistor of a mounted resistor and a resistor virtually representing insulation from the vehicle body GND. However, here, each insulating resistor may be any one of a mounted resistor and a virtual resistor.

The resistance value of each of the insulating resistors Rp and Rn is set to a sufficiently large value, for example, several MΩ such that the corresponding insulating resistor rarely conducts electricity when it is normal. However, when the insulating resistor Rp or Rn is abnormal due to a deterioration, for example, the resistance value thereof decreases, whereby the assembled battery 10 is short-circuited with the vehicle body GND or the like, or becomes a state close to a short-circuited state.

Figure 7:
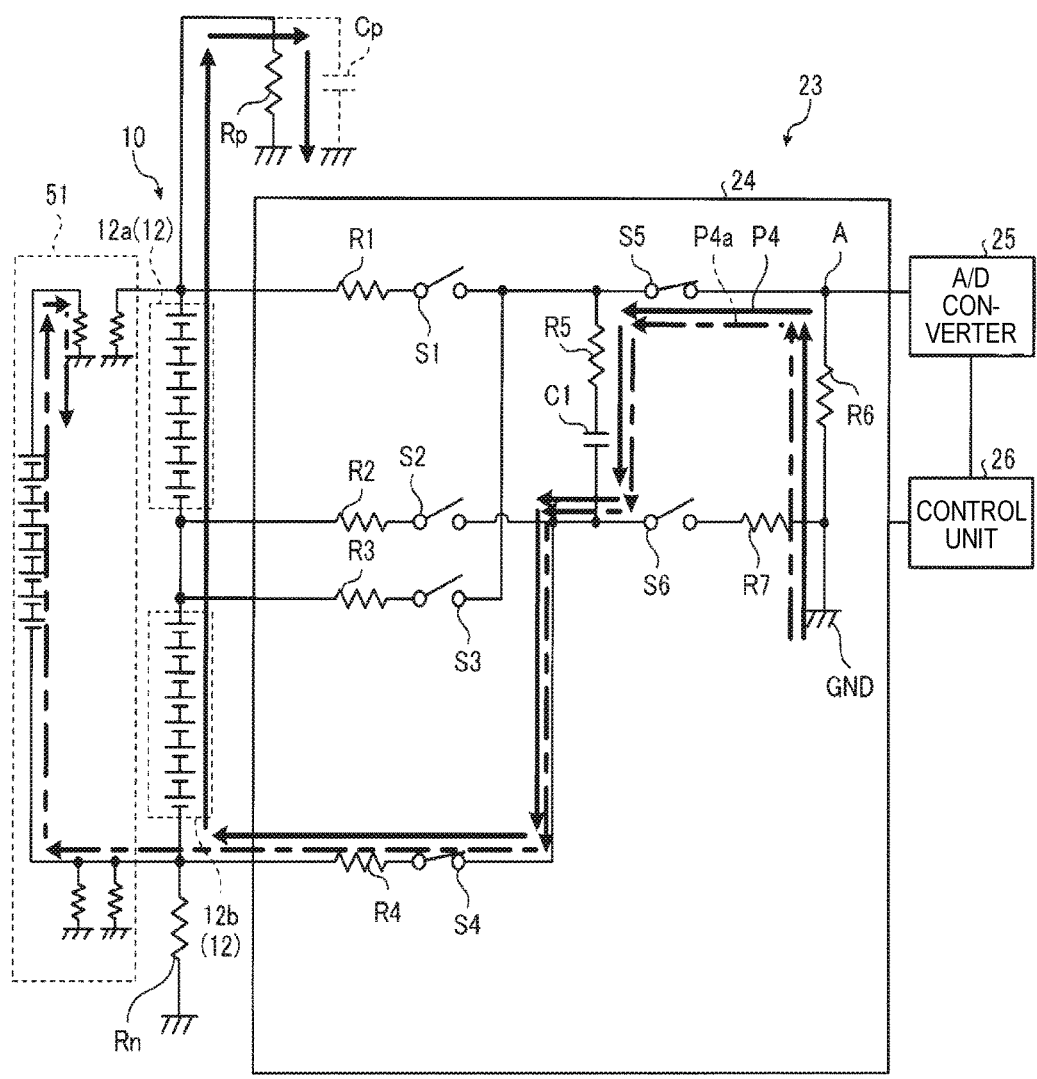
FIG. 7 is a view illustrating a charging path in a case of detecting a deterioration in an insulation resistor of the positive electrode side of an assembled battery.
Figure 8:
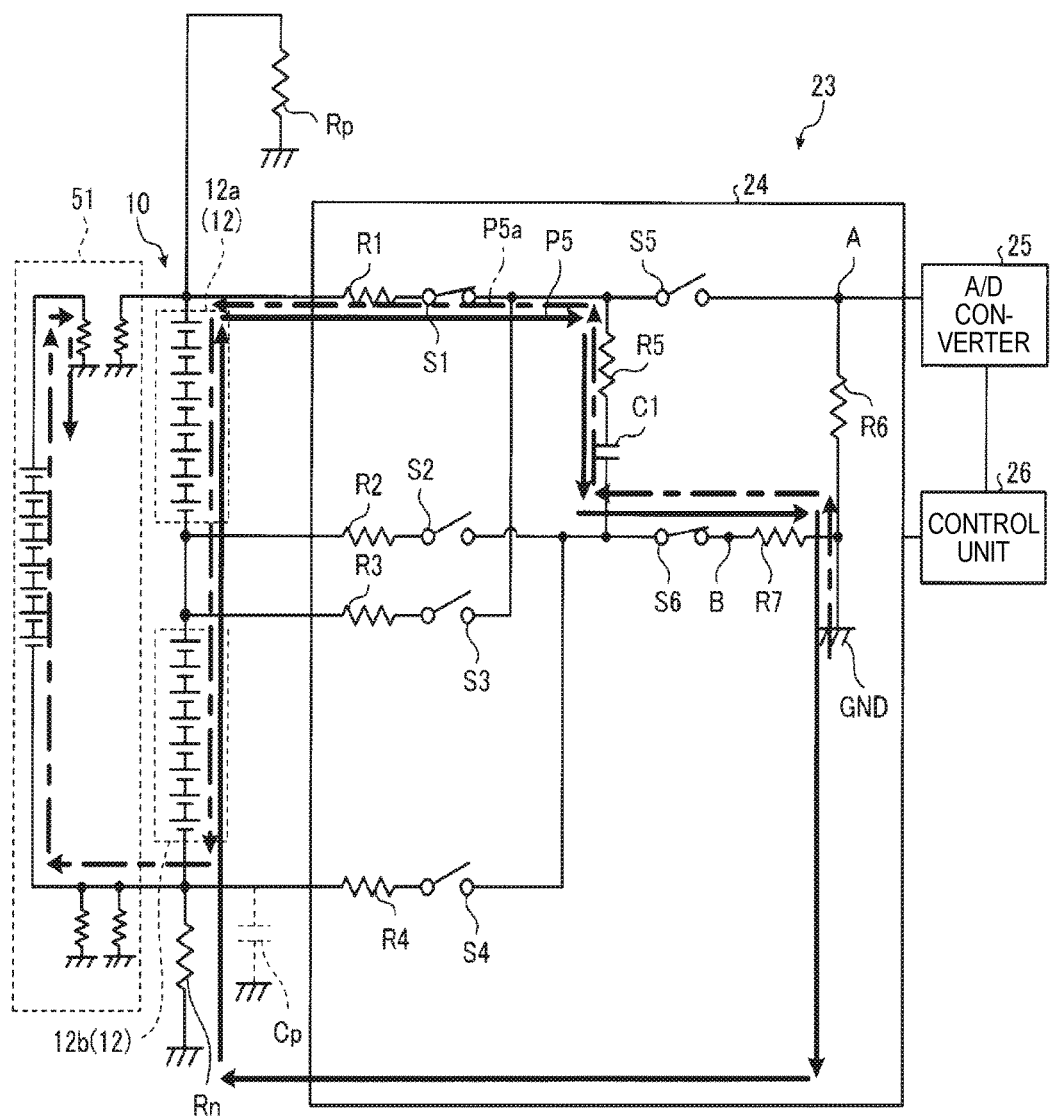
FIG. 8 is a view illustrating a charging path in a case of detecting a deterioration in an insulation resistor of the negative electrode side of the assembled battery.

Now, charging and discharging on the capacitor C1 which are performed in order to detect a deterioration in the insulating resistor Rp or Rn of the assembled battery 10 will be described with reference to FIGS. 7 and 8. FIG. 7 is a view illustrating a charging path in a case of detecting a deterioration in the insulating resistor Rp of the positive electrode side of the assembled battery 10. Also, FIG. 8 is a view illustrating a charging path in a case of detecting a deterioration in the insulating resistor Rn of the negative electrode side of the assembled battery 10.

First, in the case of detecting a deterioration in the insulating resistor Rp of the positive electrode side, as shown in FIG. 7, the fourth switch S4 and the fifth switch S5 are turned on, and the other switches S1 to S3 and S6 are turned off. As a result, the positive electrode side of the first stack 12a is connected to the negative electrode side of the first stack 12a through the insulating resistor Rp, the sixth resistor R6, the fifth switch S5, the fifth resistor R5, the capacitor C1, the fourth switch S4, the fourth resistor R4, and the second stack 12b.

In other words, a fourth path P4 is formed so as to connect the first and second stacks 12a and 12b and the capacitor C1 through the insulating resistor Rp of the positive electrode side. At this time, if the resistance value of the insulating resistor Rp is normal, the fourth path P4 rarely conducts electricity; whereas if the insulating resistor Rp has deteriorated, resulting in a decrease in the resistance value, the fourth path P4 conducts electricity.

After the fourth path P4 is formed, if a predetermined time elapses, the fourth switch S4 is turned off while the sixth switch S6 is turned on, whereby the voltage of the capacitor C1 is discharged (see FIG. 5). The voltage of the capacitor C1 which is detected at that time is referred to as the "voltage VRp", and on the basis of the voltage VRp, a deterioration in the insulating resistor Rp is detected. This will be described below.

In the case of detecting a deterioration in the insulating resistor Rn of the negative electrode side, as shown in FIG. 8, the first switch S1 and the sixth switch S6 are turned on, and the other switches S2 to S5 are turned off. As a result, the positive electrode side of the first stack 12a is connected to the negative electrode side of the first stack 12a through the first resistor R1, the first switch S1, the fifth resistor R5, the capacitor C1, the sixth switch S6, the seventh resistor R7, the insulating resistor Rn, and the second stack 12b.

In other words, a fifth path P5 is formed so as to connect the first and second stacks 12a and 12b and the capacitor C1 through the insulating resistor Rn of the negative electrode side. At this time, if the resistance value of the insulating resistor Rn is normal, the fifth path P5 rarely conducts electricity; whereas if the insulating resistor Rn has deteriorated, resulting in a decrease in the resistance value, the fifth path P5 conducts electricity.

After the fifth path P5 is formed, if a predetermined time elapses, as shown in FIG. 5, the voltage of the capacitor C1 is discharged. The voltage of the capacitor C1 which is detected at that time is referred to as the "voltage VRn", and on the basis of the voltage VRn, a deterioration in the insulating resistor Rn is detected. This will be described below.

Also, in a process of detecting a deterioration in the insulating resistor Rp or Rn, charging is performed for a predetermined time shorter than the time required for full charging, and the charged voltage is used as the voltage VRp or VRn to detect a deterioration in the insulating resistor Rp or Rn.

By the way, in the above described charging/discharging system 1, for example, in a state where the charging path (the fifth path P5) for detecting a deterioration in the insulating resistor Rn has been formed, the boost converter 51 may operate. In this case, for example, due to the state of the insulating resistor Rn, the operation timing of the boost converter 51, or the like, the body voltage may change to be larger than the voltage of the electric power source.

If the body voltage is larger than the voltage of the electric power source, the capacitor C1 is charged with a negative voltage. Specifically, if a current flows from the boost converter 51 through a charging path P5a as shown in FIG. 8, whereby the current of the charging path P5a is higher than the current of the fifth path P5, the capacitor C1 is charged with a negative voltage. In this case, in the technology according to the related art, it is impossible to accurately detect the voltage of the capacitor C1, and as a result, the accuracy of detection on a deterioration in the insulating resistor Rn may decrease.

Meanwhile, for example, in a state where the charging path (the fifth path P4) for detecting a deterioration in the insulating resistor Rp has been formed, if the boost converter 51 operates, a current may flow from the boost converter 51 through a charging path P4a. Both of the charging path P4a and the charging path P5a shown in FIGS. 7 and 8 are examples of current flows.

In the above described case, since the capacitor C1 is charged not only with the voltage from the first and second stacks 12a and 12b but also with the voltage from the boost converter 51, the voltage of the capacitor C1 rises, whereby it becomes difficult to accurately detect a deterioration in the insulating resistor Rp.

For this reason, the deterioration detecting apparatus 23 according to the present embodiment is configured so as to be able to improve the accuracy of detection on a deterioration in the insulating resistors Rp and Rn even in a case where the deterioration detecting apparatus includes the boost converter 51. Hereinafter, the configuration of the deterioration detecting apparatus 23 will be described in more detail.

As shown in FIG. 2, the control unit 26 of the deterioration detecting apparatus 23 is a micro computer including a CPU, a RAM, a ROM, and so on, and controls the whole of the deterioration detecting apparatus 23 including the voltage detection circuit unit 24, the A/D converter 25, and so on. Specifically, the control unit 26 includes a charging-path forming unit 26a, a discharging-path forming unit 26b, a voltage detecting unit 26c, a charged-state monitoring unit 26d, and a deterioration detecting unit 26e.

The charging-path forming unit 26a controls the first to sixth switches S1 to S6, thereby forming any one of the first path P1 and the third to fifth paths P3 to P5, that is, a charging path (see FIG. 4 and FIGS. 6 to 8).

Also, a switching pattern of the first to sixth switches S1 to S6 is stored in advance in a storage unit such as a RAM or a ROM. Then, the charging-path forming unit 26a or the discharging-path forming unit 26b reads the switching pattern from the storage unit at an appropriate timing, and forms a charging path or the discharging path.

The discharging-path forming unit 26b controls the first to sixth switches S1 to S6, thereby forming the second path P2, that is, the discharging path (see FIG. 5).

If the discharging path is formed by the discharging-path forming unit 26b, the voltage detecting unit 26c detects the voltage of the charged capacitor C1 through the A/D converter 25. Specifically, the voltage detecting unit 26c detects the first and second stack voltages and the voltages VRn and VRp described above.

Also, the voltage detecting unit 26c is configured so as to be able to detect the charged negative voltage of the capacitor C1. Therefore, for example, even in a case where the capacitor C1 is charged with a negative voltage as described above, it is possible to accurately detect the voltage of the capacitor C1, and thus it is possible to improve the accuracy of detection on a deterioration in the insulating resistors Rp and Rn.

Specifically, the input voltage range of the A/D converter 25 which is provided between the voltage detecting unit 26c and the capacitor C1 is offset so as to include positive voltages and negative voltages. In other words, for example, in a case where the input voltage range of the A/D converter 25 is from 0 V to 200 V, the input voltage range is offset so as to become from −100 V to 100 V. As a result, the voltage detecting unit 26c has a simple configuration and can detect the negative voltage of the capacitor C1.

Also, in the above description, in order to detect the negative voltage of the capacitor C1, the input voltage range of the A/D converter 25 is offset. However, the present invention is not limited thereto. For example, the input voltage range of the A/D converter 25 may be expanded so as to include positive voltages and negative voltages, or an A/D converter 25 usable to detect a positive voltage and an A/D converter 25 usable to detect a negative voltage may be separately provided.

The voltage detecting unit 26c outputs a signal representing the voltage of the capacitor C1 detected, to the charged-state monitoring unit 26d and the deterioration detecting unit 26e.

In a case where the capacitor C1 is charged through the first path P1 or the third path P3 (see FIGS. 4 and 6) and then the first or second stack voltage is detected, the charged-state monitoring unit 26d monitors the charged state of the first or second stack 12a or 12b on the basis of the detected first or second stack voltage. Then, the charged-state monitoring unit 26d outputs information representing the result of monitoring on the charged state of the assembled battery 10 including the first and second stacks 12a and 12b, to the vehicle control device 30 (see FIG. 1). According to the result of monitoring on the charged state of the assembled battery 10, the vehicle control device 30 performs vehicle control as described above.

In a case where the capacitor C1 is charged through the fourth path P4 or the fifth path P5 (see FIGS. 7 and 8) and then the voltage VRp or VRn of the capacitor C1 is detected, the deterioration detecting unit 26e detects a deterioration in the insulating resistor Rp or Rn, on the basis of the detected voltage.

Specifically, since the voltage with which the capacitor C1 is charged increases if a deterioration occurs in the insulating resistor Rp or Rn, in a case where the voltage of the charged capacitor C1 increases, a deterioration in the insulating resistor Rp or Rn is detected.

Specifically, the deterioration detecting unit 26e first adds the voltage VRp and the voltage VRn, thereby calculating the voltage (VRp+VRn). As a result, it becomes possible to eliminate the influence of the boost converter 51 on detection on a deterioration in the insulating resistors Rp and Rn.

That is, as shown in FIGS. 7 and 8, the voltage VRp or the voltage VRn with which the capacitor C1 is charged includes not only the voltage from the first and second stacks 12a and 12b but also the voltage from the boost converter 51. Specifically, the voltage VRp and the voltage VRn are as follow.

Voltage VRp=(Voltage From Stacks)+(Voltage From Boost Converter)

Voltage VRn=(Voltage From Stacks)−(Voltage From Boost Converter)

Therefore, for example, if the voltage VRp and the voltage VRn are used to detect a deterioration in the insulating resistors Rp and Rn as they are, it may be impossible to accurately detect a deterioration due to the magnitude of the voltage from the boost converter 51.

For this reason, in the present embodiment, the voltage VRp and the voltage VRn are added, whereby the voltage from the boost converter 51 is offset. Further, the added voltage (VRp+VRn) is used to detect a deterioration in the insulating resistors Rp and Rn, whereby it becomes possible to eliminate the influence of the boost converter 51.

Here, it is preferable that the time constants of the charging paths P4 and P4a shown in FIG. 7 should be set to be the same as the time constants of the charging paths P5 and P5a shown in FIG. 8.

Specifically, as shown in FIG. 7, the sixth resistor R6 is provided on the fourth path P4 which is the charging path for detecting a deterioration in the insulating resistor Rp of the positive electrode side, and one end thereof is connected to the vehicle body GND, and the other end is connected to the capacitor C1. Also, as shown in FIG. 8, the seventh resistor R7 is provided on the fifth path P5 which is the charging path for detecting a deterioration in the insulating resistor Rn of the negative electrode side, and one end thereof is connected to the vehicle body GND, and the other end is connected to the capacitor C1.

For example, in a case where the resistance value of the sixth resistor R6 and the resistance value of the seventh resistor R7 are set to be different from each other, the voltage from the boost converter 51 included in the voltage VRp becomes different from the voltage from the boost converter 51 included in the voltage VRn. Therefore, even if the voltage VRp and the voltage VRn are added as described above, it may be impossible to offset the voltage from the boost converter.

For this reason, in the present embodiment, for example, the resistance value of the sixth resistor R6 and the resistance value of the seventh resistor R7 are set to the same value, whereby the time constants of the charging paths P4 and P4a and the time constants of the charging paths P5 and P5a become the same as each other. As a result, in a case of adding the voltage VRp and the voltage VRn, it becomes possible to surely offset the voltage from the boost converter 51. Also, in this specification, it will be understood that when an element is referred to as being completely the same as another element, it may be almost the same as the other element.

The deterioration detecting unit 26e compares the added voltage (VRp+VRn) with a predetermined threshold value Va, and detects a deterioration in the insulating resistors Rp and Rn on the basis of the comparison result. Here, in the present embodiment, since the threshold value Va is set to a voltage value, it is possible to reduce the time required for the deterioration detecting unit 26e to perform a process of detecting a deterioration in the insulating resistors Rp and Rn.

Specifically, in the technology according to the related art, for example, the resistance value of the insulating resistor Rp or Rn is calculated on the basis of the voltage VRp or VRn of the capacitor C1 and the stack voltages. Further, in the technology according to the related art, in a case where the calculated resistance value is less than a threshold value which is a predetermined resistance value, a deterioration in the insulating resistor Rp or Rn is detected. Therefore, it requires time to perform the process of calculating the resistance values of the insulating resistors Rp and Rn, and it takes a long time to perform the process of detecting a deterioration in the insulating resistors Rp and Rn.

In a case where there is no deterioration in the insulating resistor Rp or the insulating resistor Rn and thus there is no decrease in the resistance value thereof, the capacitor C1 is rarely charged, or is charged with a low voltage. For this reason, the deterioration detecting unit 26e according to the present embodiment is configured so as to compare the voltage (VRp+VRn) with the predetermined threshold value Va which is a relatively small voltage value.

In a case where the voltage (VRp+VRn) of the capacitor C1 is equal to or greater than the threshold value Va, the deterioration detecting unit 26e detects a deterioration in the insulating resistors Rp and Rn, in other words, it determines that an abnormality has occurred in the insulating resistors Rp and Rn. Meanwhile, in a case where the voltage (VRp+VRn) is less than the threshold value Va, the deterioration detecting unit 26e determines that there is no deterioration in the insulating resistors Rp and Rn, in other words, that the insulating resistors Rp and Rn are normal.

As described above, in the present embodiment, since the threshold value Va is set to a voltage value, it is possible to reduce the time required for the process of detecting a deterioration in the insulating resistors Rp and Rn, by the time of the process of calculating the resistance values of the insulating resistors Rp and Rn.

Also, in the above description, the voltage (VRp+VRn) is used to detect a deterioration in the insulating resistors Rp and Rn. However, the present invention is not limited thereto. For example, the input voltage of the A/D converter 25 may be used.

Also, the voltage (VRp+VRn) of the capacitor C1 varies according to a variation in the stack voltage which is supplied to the capacitor C1. For this reason, the deterioration detecting unit 26e is configured so as to change the threshold value Va according to the stack voltage. Specifically, the deterioration detecting unit 26e is configured so as to increase the threshold value Va as the stack voltage increases. Here, the stack voltage is the sum of the first stack voltage of the first stack 12a and the second stack voltage of the second stack 12b.

Therefore, in the deterioration detecting unit 26e, it is possible to set the threshold value Va to an appropriate voltage value corresponding to a variation in the stack voltage, and thus it possible to further improve the accuracy of detection on a deterioration in the insulating resistors Rp and Rn.

Also, it is preferable that the deterioration detecting unit 26e should change the threshold value Va according to the stack voltage detected immediately before comparison between the voltage (VRp+VRn) of the capacitor C1 and the threshold value Va by the voltage detecting unit 26c. In this case, it is possible to set the threshold value Va to an appropriate voltage value corresponding to the current charged state of the electric power source.

Also, in the above description, the stack voltage detected immediately before comparison by the voltage detecting unit 26c is used. However, the present invention is not limited thereto. For example, the deterioration detecting unit 26e may be configured so as to calculate the average value of stack voltages detected a plurality of times by the voltage detecting unit 26c and change the threshold value Va according to the corresponding average value.

In this case, for example, even if the stack voltage instantaneously varies, the threshold value Va does not vary rapidly, and thus it is possible to set the threshold value Va to an appropriate voltage value corresponding to the charged state of the electric power source. Also, as the above described average value, various average values such as a simple average and a weighted average can be applied.

The above described threshold value Va may be stored, for example, in a storage unit, in advance. In this case, since the deterioration detecting unit 26e needs only to read the threshold value Va according to the stack voltage from the storage unit, it is possible to further more reduce the time required for the process of detecting a deterioration in the insulating resistors Rp and Rn, and it is also possible to reduce the processing load.

Also, in the present embodiment, for example, it is preferable to connect a reference resistor (not shown) or the like for forcibly causing an electricity leakage state to the fourth path P4 or the fifth path P5, and set the value of the charged voltage (VRp+VRn) of the capacitor C1 as the threshold value Va in the electricity leakage state.

If the threshold value Va is set on the basis of measured values as described above, for example, even in a case where the capacitor C1 and the resistors R1 to R7 have individual differences, it is possible to set the threshold value Va to absorb the individual differences, and it possible to further improve the accuracy of detection on a deterioration in the insulating resistors Rp and Rn.

The deterioration detecting unit 26e outputs information representing the deterioration states of the insulating resistors Rp and Rn to the vehicle control device 30 and the like. Then, the vehicle control device 30 performs vehicle control according to the deterioration states, an operation of issuing a notification to a user, and so on.

Figure 9:
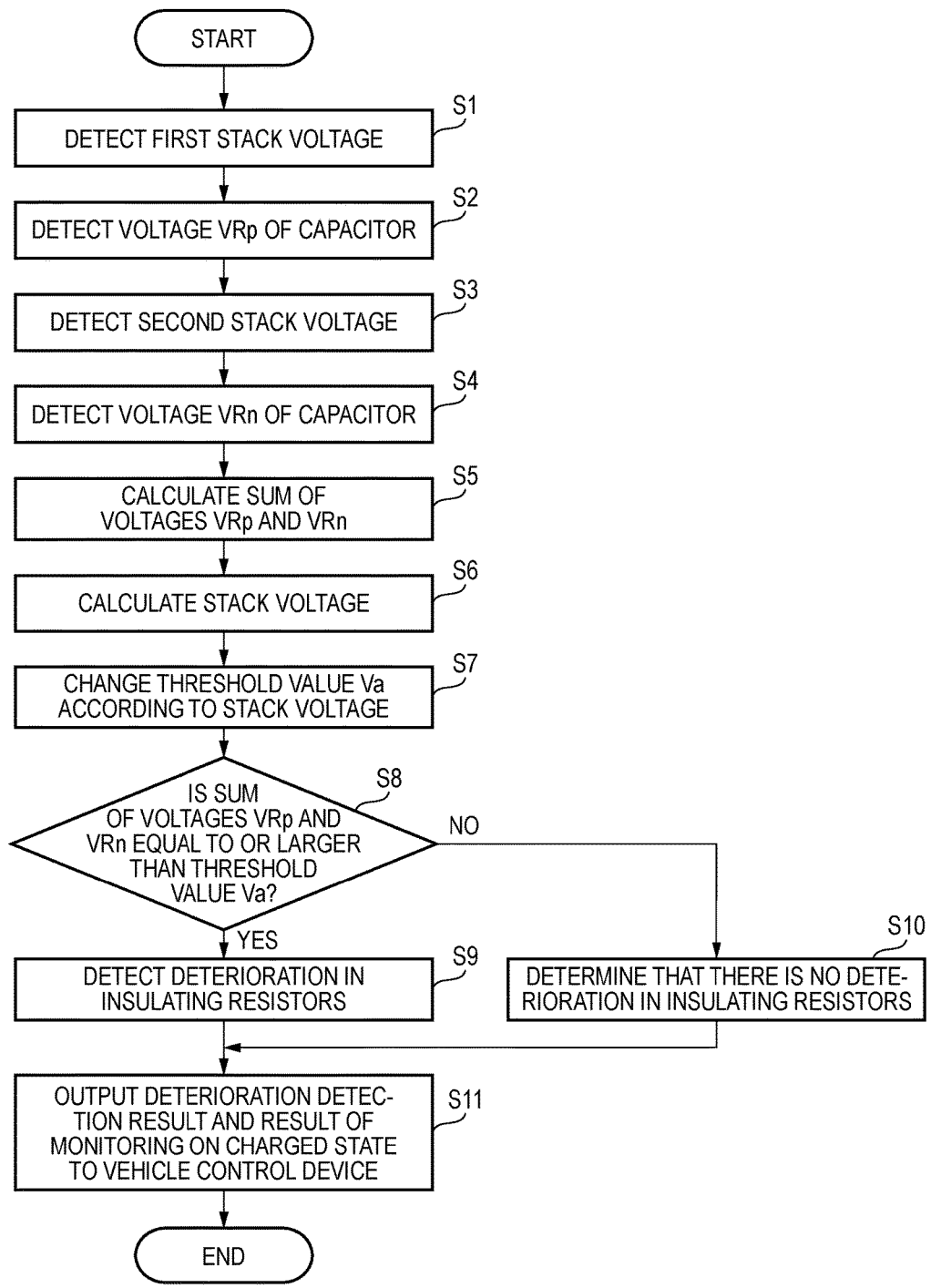
FIG. 9 is a flow chart illustrating a part of the process procedure of processes which are performed in a battery monitoring system.

3. Specific Operations of Charged-State Monitoring Process and Deterioration Detecting Process Now, specific operations of a charged-state monitoring process and a deterioration detecting process which are performed in the battery monitoring system 20 configured as described above will be described with reference to FIG. 9. FIG. 9 is a flow chart illustrating a portion of the process procedure of processes which are performed by the battery monitoring system 20. Also, the various processes shown in FIG. 9 are performed on the basis of control of the control unit 26 of the deterioration detecting apparatus 23.

As shown in FIG. 9, the control unit 26 detects the first stack voltage of the first stack 12a in STEP S1, and subsequently detects the voltage VRp of the capacitor C1 in STEP S2. Next, the control unit 26 detects the second stack voltage of the second stack 12b in STEP S3, and subsequently detects the voltage VRn of the capacitor C1 in STEP S4.

Thereafter, the control unit 26 calculates the voltage (VRp+VRn) in STEP S5, and calculates the stack voltage in STEP S6. The stack voltage is, for example, the sum of the first stack voltage and the second stack voltage detected in STEPS S1 and S3.

Subsequently, in STEP S7, the control unit 26 changes the threshold value Va according to the stack voltage. The process of changing the threshold value Va does not need to be performed whenever a stack voltage is detected, and may be performed once, for example, whenever stack voltage detection is performed a plurality of times.

In STEP S8, the control unit 26 compares the voltage (VRp+VRn) with the changed threshold value Va. Then, in a case where the voltage (VRp+VRn) is equal to or greater than the threshold value Va ("Yes" in STEP S8), in STEP S9, the control unit 26 detects a deterioration in the insulating resistors Rp and Rn. Meanwhile, in a case where the voltage (VRp+VRn) is less than the threshold value Va ("No" in STEP S8), in STEP S10, the control unit 26 determines that there is no deterioration in the insulating resistors Rp or Rn.

Subsequently, in STEP S11, the control unit 26 outputs information representing the deterioration states of the insulating resistors Rp and Rn, and information representing the first and second stack voltages and the stack voltage, as the deterioration detection result and the result of monitoring on the charged state of the assembled battery 10, to the vehicle control device 30, respectively.

As described above, the deterioration detecting apparatus 23 according to the first embodiment includes the capacitor C1, the voltage detecting unit 26c, and the deterioration detecting unit 26e. Also, in a case where the vehicle includes the voltage converter 50, the voltage converter 50 raises the voltage output from the electric power source, and supplies the corresponding voltage to the motor 40.

The capacitor C1 is connected to the insulated electric power source, thereby being charged or discharged. The voltage detecting unit 26c detects the voltage of the capacitor C1. The deterioration detecting unit 26e detects a deterioration in the insulating resistors Rp and Rn on the basis of the voltages VRn and VRp of the capacitor C1 detected by the voltage detecting unit 26c. Further, the voltage detecting unit 26c can detect the charged negative voltage of the capacitor C1.

Therefore, in the deterioration detecting apparatus 23, it is possible to improve the accuracy of detection on a deterioration in the insulating resistors Rp and Rn even in a case where the vehicle includes the voltage converter 50 for raising the voltage output from the electric power source.

Also, in the deterioration detecting apparatus 23, the voltage detecting unit 26c detects the voltage VRp and VRn of the capacitor C1 charged through a charging path (the fourth path P4 or the fifth path P5) for detecting a deterioration in the insulating resistors Rp and Rn. The deterioration detecting unit 26e compares the voltages VRp and VRn of the capacitor C1 with the threshold value Va which is a predetermined voltage value, and detects a deterioration in the insulating resistors Rp and Rn on the basis of the comparison result. Therefore, it is possible to reduce the time required for the deterioration detecting unit 26e to perform a process of detecting a deterioration in the insulating resistors Rp and Rn.

4. Configuration of Deterioration Detecting Apparatus According to Second Embodiment Second Embodiment Now, a charging/discharging system 1 including a deterioration detecting apparatus 23 according to a second embodiment will be described. Hereinafter, components identical to those of the first embodiment are denoted by the same reference symbols, and will not be described.

The vehicle has floating capacity unintended during design. Due to the influence of the floating capacity, for example, it may be impossible to accurately detect the voltage VRp or VRn of the capacitor C1, resulting in a reduction in the accuracy of detection on a deterioration in the insulating resistor Rp or Rn.

For this reason, for example, it can be considered a method of adding resistors, switches, and the like usable to measure the floating capacity to the circuit of the voltage detection circuit unit 24, and measuring the floating capacity, and detecting a deterioration in the insulating resistor Rp or Rn in view of the measured floating capacity. However, the above method may complicate the configuration of the deterioration detecting apparatus 23 by adding the elements such as resistors, resulting in an increase in the cost.

For this reason, in the second embodiment, the deterioration detecting apparatus 23 is configured so as to be able to have a simple configuration, and be able to estimate the floating capacity, and be able to accurately detect a deterioration in the insulating resistor Rp or Rn in view of the estimated floating capacity.

Figure 10:
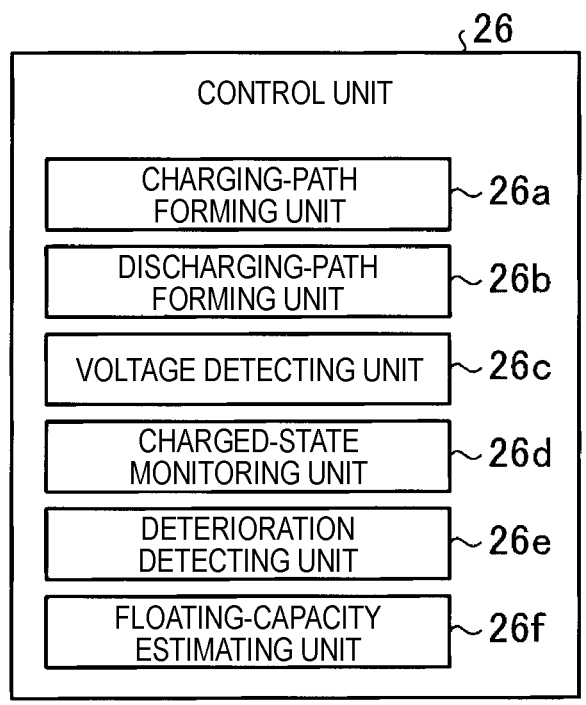
FIG. 10 is a block diagram illustrating an example of the configuration of a control unit of a deterioration detecting apparatus according to a second embodiment.

FIG. 10 is a block diagram illustrating an example of the configuration of a control unit 26 of a deterioration detecting apparatus 23 according to the second embodiment. As shown in FIG. 10, the control unit 26 includes a floating-capacity estimating unit 26f, in addition to the deterioration detecting unit 26e and so on.

The floating-capacity estimating unit 26f estimates the floating capacity of a charging path on the basis of the voltage of the detection point A (see FIG. 7). Also, in FIGS. 7 and 8, floating capacity is virtually shown by broken lines, and is denoted by a reference symbol "Cp".

Figure 11:
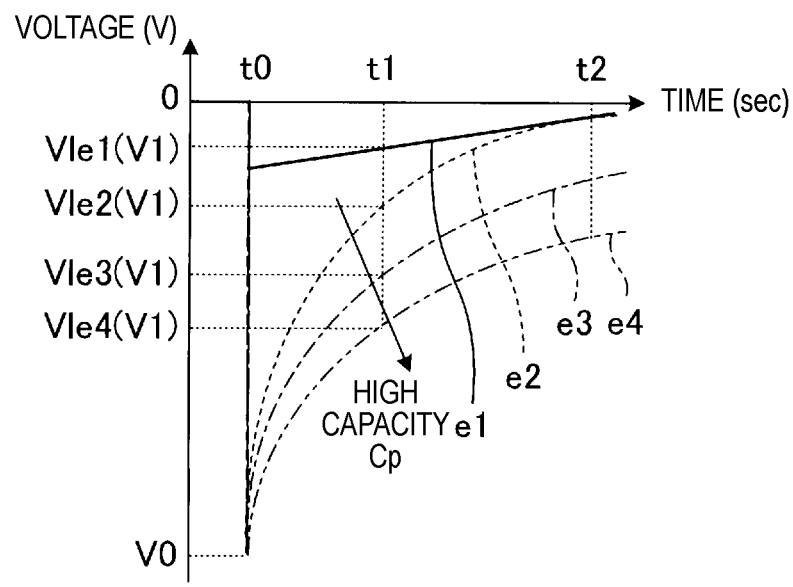
FIG. 11 is a graph for explaining a floating-capacity estimating process which is performed in a floating-capacity estimating unit.

FIG. 11 is a graph for explaining a process of estimating the floating capacity Cp which is performed by the floating-capacity estimating unit 26f. Also, in the example shown in FIG. 11, there is shown variation of the voltage of the detection point A when the charging path (the fourth path P4) for detecting a deterioration in the insulating resistor Rp of the positive electrode side has been formed.

Also, in the example shown in FIG. 11, voltage variation in a case where the floating capacity Cp does not exist is shown by a solid line e1, and voltage variations in cases where the floating capacity Cp has increased are shown in the order of a broken line e2, an alternate long and short dash line e2, and an alternate long and two short dashes line e3.

Also, in the example shown in FIG. 11, the moment when the fourth switch S4 and the fifth switch S5 are turned on such that the fourth path P4 is formed is represented by a time t0, and a time earlier than a time when the capacitor C1 is fully charged is represented by a time t2. Also, a time which is between the time t0 and the time t2 and is after a predetermined time from the time t0 is represented by a time t1.

Prior to description of FIG. 11, the detection point A will be described with reference to FIG. 7. As described above, the sixth resistor R6 is provided on the fourth path P4 for detecting a deterioration in the insulating resistor Rp, and one end side thereof is connected to the vehicle body GND (the ground point). On the other end side of the sixth resistor R6, there is the detection point A.

In a case where there is floating capacity Cp, when the fourth switch S4 and the fifth switch S5 are turned on, an inrush current attributable to the floating capacity Cp flows, whereby the voltage of the detection point A suddenly falls toward the negative voltage side for the moment (see the time t0 of FIG. 11). Thereafter, the voltage of the detection point A gradually rises, thereby returning. Meanwhile, in a case where there is no floating capacity Cp, since the voltage of the detection point A is determined only on the basis of the resistance values of the insulating resistor Rp, the resistors R4 to R6, and the like, the voltage of the detection point A slightly falls toward the negative voltage side.

In the case where there is floating capacity Cp, for example, if the floating capacity Cp is relatively low, since electric charge is easily collected, the voltage of the detection point A suddenly returns as shown by the broken line e2 of FIG. 11. Meanwhile, for example, if the floating capacity Cp is relatively high, since electric charge is slowly collected, the voltage of the detection point A slowly returns as shown by the alternate long and two short dashes line e4 of FIG. 11.

In the second embodiment, in view of the relation between the floating capacity Cp and variation of the voltage of the detection point A, the floating capacity Cp is estimated.

Specifically, the floating-capacity estimating unit 26$f$ calculates a voltage variation rate Vd on the detection point A, on the basis of the voltage V0 of the detection point A detected immediately after formation of a charging path, and the voltage V1 of the detection point A detected after a predetermined time t1 from the formation of the charging path. Also, in FIG. 11, in the case of the solid line e1, the voltage of the detection point A is represented by V1e1, and in the cases of the lines e2, e3, and e4, the voltages of the detection point A are represented by Ve2, Ve3, and Ve4, respectively.

Specifically, the voltage variation rate Vd is a value which is obtained by subtracting the absolute value of the voltage V1 from the absolute value of the voltage V0 and dividing the difference by the absolute value of the voltage V0 as shown in the following expression.

[Voltage Variation Rate $Vd$]=(|$V0$|−|$V1$|)/|$V0$|

Subsequently, the floating-capacity estimating unit 26$f$ estimates the floating capacity Cp on the basis of the calculated voltage variation rate Vd. Specifically, the floating-capacity estimating unit 26$f$ is configured so as to estimate smaller floating capacity Cp as the voltage variation rate Vd increases.

Also, in a case where the floating capacity Cp is fully charged before the switches S4 and S5 are turned on, the voltage which falls toward the negative voltage side at the time t0 becomes substantially constant (at the voltage V0) regardless of the magnitude of the floating capacity Cp. For this reason, for example, the floating-capacity estimating unit 26$f$ may be configured so as to estimate floating capacity on the basis of the voltage V1 at the time t1.

As described above, the floating-capacity estimating unit 26$f$ is configured so as to have a simple configuration and be able to easily estimate floating capacity Cp. Also, because of the simple configuration, it is possible to reduce the cost of the deterioration detecting apparatus 23.

Also, the time from the time t0 to the time t1 can be set to an arbitrary time. For example, it is preferable to set the corresponding time such that it is possible to distinguish the voltage variation (the voltage variation rate Vd) of the detection point A according to the magnitude of floating capacity Cp.

Also, since the voltage detecting unit 26$c$ is configured so as to be able to detect a negative voltage, even in a case where the voltage of the detection point A falls toward the negative voltage side, it is possible to detect the corresponding voltage.

Also, although the voltage detecting unit 26$c$ uses the A/D converter 25 to detect a negative voltage, the present invention is not limited thereto. For example, as shown by an imaginary line in FIG. 3, an A/D converter 25$a$ usable to estimate floating capacity Cp may be newly provided.

Also, although the floating-capacity estimating unit 26$f$ is configured so as to estimate floating capacity Cp on the basis of the voltage of the detection point A, the present invention is not limited thereto. For example, on the basis of the voltage of a detection point B shown in FIG. 8, floating capacity Cp may be estimated.

In order to describe the detection point B, the seventh resistor R7 will be first described. The seventh resistor is provided on the fifth path P5 for detecting a deterioration in the insulating resistor Rn of the negative electrode side, and one end side thereof is connected to the vehicle body GND (the ground point). On the other end side of the seventh resistor R7, there is the detection point B.

Although not shown, in a case where there is floating capacity Cp, when the first switch S1 and the sixth switch S6 are turned on, an inrush current attributable to the floating capacity Cp flows, whereby the voltage of the detection point B suddenly rises toward the positive voltage side for the moment, and then gradually falls, thereby returning. Therefore, the floating-capacity estimating unit 26$f$ can estimate floating capacity Cp on the basis of the voltage of the detection point B. Also, the sixth resistor R6 and the seventh resistor R7 are examples of voltage detection resistors.

Figure 12:
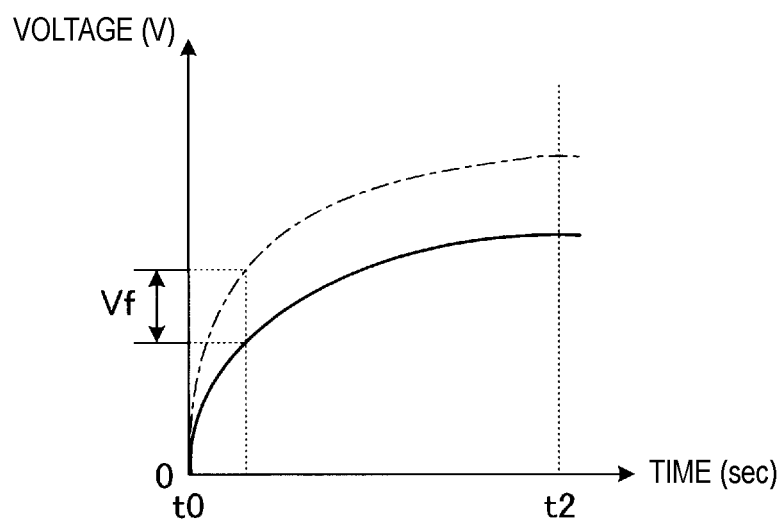
FIG. 12 is a graph for explaining a correction process which is performed in a deterioration detecting unit.

On the basis of the floating capacity Cp estimated by the floating-capacity estimating unit 26$f$, the deterioration detecting unit 26$e$ corrects the voltage VRp or VRn of the capacitor C1. FIG. 12 is a graph for explaining a correction process which is performed by the deterioration detecting unit 26$e$.

In the example shown in FIG. 12, there is shown variation of the charged voltage of the capacitor C1 when the charging path (the fourth position P4) for detecting a deterioration in the insulating resistor Rp of the positive electrode side has been formed. Also, in the example shown in FIG. 12, variation of the charged voltage in a case where there is no floating capacity Cp is shown by a solid line, and variation of the charged voltage in a case where there is floating capacity Cp is shown by an alternate long and short dash line.

In the case where there is floating capacity Cp, at the moment (the time t0) when the fourth switch S4 and the fifth switch S5 are turned on such that the fourth path P4 is formed, an inrush current attributable to the floating capacity Cp flows into the capacitor C1, and thus the charged voltage rapidly increases as compared to the case where there is no floating capacity Cp. The increment Vf of the charged voltage increases as the floating capacity Cp increases, in other words, as the inrush current increases.

For this reason, the deterioration detecting unit 26$e$ calculates the increment Vf of the charged voltage of the capacitor C1 attributable to the floating capacity Cp, on the basis of the estimated floating capacity Cp. Thereafter, the deterioration detecting unit 26$e$ corrects the voltage VRp of the capacitor C1 detected on the second path (the discharging path) P2 formed after formation of the fourth path P4 by the voltage detecting unit 26$c$, with the increment Vf. That is, the deterioration detecting unit subtracts the increment Vf from the voltage VRp of the capacitor C1, and replaces the voltage VRp with the obtained difference.

Also, the deterioration detecting unit 26$e$ may correct the voltage VRn of the capacitor C1 detected on the second path (the discharging path) P2 formed after formation of the fifth path P5 by the voltage detecting unit 26$c$, with the increment Vf.

Further, the deterioration detecting unit 26e can detect a deterioration in the insulating resistors Rp and Rn on the basis of the corrected voltages VRp and VRn of the capacitor C1, thereby capable of improving the accuracy of detection on a deterioration in the insulating resistors Rp and Rn.

<5. Specific Operations of Charged-State Monitoring Process and Deterioration Detecting Process According to Second Embodiment>

Figure 13:
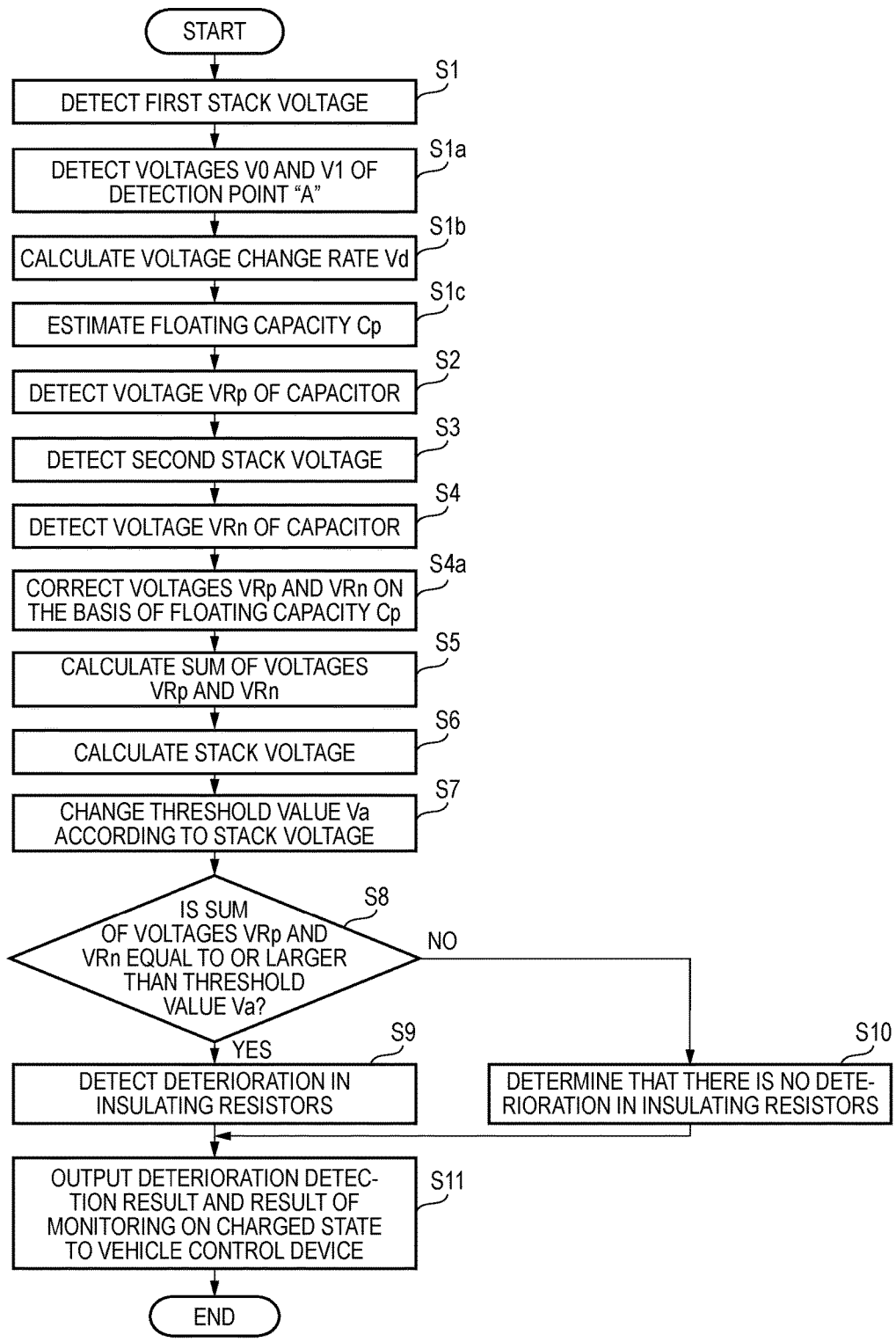
FIG. 13 is a flow chart illustrating a part of the process procedure of processes which are performed in a battery monitoring system according to the second embodiment.

Now, specific operations of a charged-state monitoring process and a deterioration detecting process which are performed in the battery monitoring system 20 according to the second embodiment will be described with reference to FIG. 13. FIG. 13 is a flow chart illustrating a part of the process procedure of processes which are performed by the battery monitoring system 20 according to the second embodiment. In FIG. 13, processes identical to those of the first embodiment are dented by the same step numbers.

As shown in FIG. 13, the control unit 26 detects the first stack voltage in STEP S1, and forms the fourth path P4, and detects the voltages V0 and V1 of the detection point A in STEP S1a. Subsequently, the control unit 26 calculates the voltage variation rate Vd in STEP S1b, and estimates the floating capacity Cp on the basis of the calculated voltage variation rate Vd in STEP S1c.

Subsequently, the control unit 26 detects the voltage VRp of the capacitor C1, the second stack voltage, and the voltage VRn of the capacitor C1 in STEPS S2 to S4, and then corrects the voltages VRn and VRp on the basis of the floating capacity Cp in STEP S4a.

Then, the control unit 26 uses the corrected voltages VRn and VRp in the processes of STEP S6 and the subsequent STEPs, thereby capable of accurately performing a deterioration in the insulating resistors Rp and Rn.

Also, since the control unit 26 performs the process of estimating the floating capacity Cp in the series of processes of detecting the voltages VRn and VRp and detecting a deterioration in the insulating resistors Rp and Rn, it is possible to efficiently perform the processes superior in the real-time property.

As described above, the deterioration detecting apparatus 23 according to the second embodiment includes the capacitor C1, the voltage detection resistors (the sixth resistor R6 and the seventh resistor R7), the voltage detecting unit 26c, the floating-capacity estimating unit 26f, and the deterioration detecting unit 26e. The capacitor C1 is connected to the insulated electric power source, thereby being charged or discharged. Each voltage detection resistor is provided on a charging path (the fourth path P4 or the fifth path P5) for detecting a deterioration in the insulating resistor Rp or Rn, and one end side thereof is connected to the ground point. After a charging path for detecting a deterioration in the insulating resistor Rp or Rn is formed, the voltage detecting unit 26c detects the voltages VRp and VRn of the capacitor C1 and the voltage of the detection point A or B located on the other end side of the corresponding voltage detection resistor. The floating-capacity estimating unit 26f estimates the floating capacity Cp of the charging path on the basis of the voltage of the detection point A or B. The deterioration detecting unit detects a deterioration in the insulating resistors Rp and Rn on the basis of the voltages VRn and VRp of the capacitor C1 and the floating capacity Cp.

Therefore, it is possible to estimate the floating capacity Cp with the simple configuration, and it is possible to use the estimated floating capacity Cp to improve the accuracy of detection on a deterioration in the insulating resistors Rp and Rn.

Also, in the above described second embodiment, in order to detect a deterioration in the insulating resistors Rp and Rn, the voltage (VRp+VRn) is calculated and is compared with the threshold value Va. However, the present invention is not limited thereto. For example, the voltage VRp and voltage VRn of the capacitor C1 may be compared with threshold values, respectively, whereby it is possible to detect a deterioration in the insulating resistor Rp or Rn. In this case, the threshold values which are compared with the voltage VRp and the voltage VRn may be set to be the same as or different from each other.

Also, in the first and second embodiments, the first stack voltage, the voltage VRp, the second stack voltage, and the voltage VRn are sequentially detected. However, this is illustrative and does not limit the present invention. The detection order can be arbitrarily set.

Also, the timing of the deterioration detecting processes in the first or second embodiment is not limited to the above described timing. For example, each deterioration detecting process may be performed at the timing of starting of the vehicle or the timing of stopping of the vehicle, or may be performed at intervals of a predetermined time or at the intervals of a predetermined traveling distance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A deterioration detecting apparatus comprising:
   a capacitor that is connected to an insulated electric power source, and is charged and discharged;
   a voltage detecting unit that detects a voltage of the capacitor; and
   a deterioration detecting unit that detects a deterioration in insulating resistors of the electric power source on the basis of the voltage of the capacitor detected by the voltage detecting unit,
   wherein the voltage detecting unit is configured to detect a charged negative voltage of the capacitor.

2. The deterioration detecting apparatus according to claim 1, further comprising:
   an A/D converter that is provided between the voltage detecting unit and the capacitor, and converts an analog value representing the voltage of the capacitor into a digital value, and outputs the digital value to the voltage detecting unit,
   wherein the input voltage range of the A/D converter is offset so as to include positive voltages and negative voltages.

3. The deterioration detecting apparatus according to claim 1, wherein:
   the insulating resistors of the electric power source includes an insulating resistor of the positive electrode side and an insulating resistor of the negative electrode side, and
   the deterioration detecting unit obtains a sum of the voltage of the capacitor charged through a charging path for detecting a deterioration in the insulating resistor of the positive electrode side and the voltage of the capacitor charged through a charging path for detecting a deterioration in the insulating resistor of the negative electrode side, and detects the deterioration in the insulating resistors of the electric power source on the basis of the sum of the voltages.

4. The deterioration detecting apparatus according to claim 3, wherein:
the resistance value of a resistor which is provided on the charging path for detecting the deterioration in the insulating resistor of the positive electrode side such that one end side thereof is connected to a ground point and the other end side is connected to the capacitor is set to be the same as the resistance value of a resistor which is provided on the charging path for detecting the deterioration in the insulating resistor of the negative electrode side such that one end side thereof is connected to the ground point and the other end side is connected to the capacitor.

5. The deterioration detecting apparatus according to claim 1, wherein:
the deterioration detecting unit compares the voltage of the capacitor with a threshold value which is a predetermined voltage value, and detects the deterioration in the insulating resistors of the electric power source on the basis of the comparison result.

6. A deterioration detecting method comprising:
a voltage detecting process of charging and discharging a capacitor connected to an insulated electric power source and detecting the voltage of the capacitor; and
a deterioration detecting process of detecting a deterioration in insulating resistors of the electric power source on the basis of the voltage of the capacitor detected in the voltage detecting process,
wherein, in the voltage detecting process, a charged negative voltage of the capacitor is detected.

7. The deterioration detecting apparatus according to claim 1, wherein:
the voltage detecting unit detects the voltage of the capacitor charged through a charging path for detecting the deterioration in insulating resistors of the electric power source, and
the deterioration detecting unit compares the voltage of the capacitor detected by the voltage detecting unit, with a threshold value which is a predetermined voltage value, and detects the deterioration in the insulating resistors of the electric power source on the basis of the comparison result.

8. The deterioration detecting apparatus according to claim 7, wherein:
the voltage detecting unit further detects the voltage of the electric power source on the basis of the voltage of the capacitor charged through a charging path for detecting the voltage of the electric power source, and
the deterioration detecting unit changes the threshold value according to the voltage of the electric power source detected by the voltage detecting unit.

9. The deterioration detecting apparatus according to claim 8, wherein:
the deterioration detecting unit changes the threshold value according to the voltage of the electric power source detected immediately before comparison between the voltage of the capacitor and the threshold value by the voltage detecting unit.

10. The deterioration detecting apparatus according to claim 8, wherein:
the deterioration detecting unit calculates an average value of the voltages of the electric power source detected a plurality of times by the voltage detecting unit, and changes the threshold value according to the corresponding average value.

11. The deterioration detecting method according to claim 6, wherein:
the voltage detecting process detects the voltage of the capacitor charged through a charging path for detecting the deterioration in insulating resistors of the electric power source, and
the deterioration detecting process compares the voltage of the capacitor detected in the voltage detecting process, with a threshold value which is a predetermined voltage value, and detects the deterioration in the insulating resistors of the electric power source on the basis of the comparison result.

* * * * *